US 8,947,946 B2

(12) United States Patent
Yamada

(10) Patent No.: US 8,947,946 B2
(45) Date of Patent: Feb. 3, 2015

(54) LEAKAGE MEASUREMENT SYSTEMS

(71) Applicant: Micron Technology, Inc., Boise, ID (US)

(72) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/084,408

(22) Filed: Nov. 19, 2013

(65) Prior Publication Data

US 2014/0071772 A1 Mar. 13, 2014

Related U.S. Application Data

(63) Continuation of application No. 13/036,409, filed on Feb. 28, 2011, now Pat. No. 8,588,007.

(51) Int. Cl.
*G11C 7/06* (2006.01)
*G11C 29/50* (2006.01)
*G11C 29/02* (2006.01)
G11C 16/04 (2006.01)
G11C 16/00 (2006.01)
G11C 29/12 (2006.01)

(52) U.S. Cl.
CPC .......... *G11C 29/025* (2013.01); *G11C 16/0483* (2013.01); *G11C 29/50008* (2013.01); *G11C 16/00* (2013.01); *G11C 2029/1202* (2013.01); *G11C 2029/5006* (2013.01)
USPC .................................................. 365/189.07

(58) Field of Classification Search
CPC ............... G11C 5/147; G11C 11/5621; G11C 29/12005

USPC .................. 365/189.07, 189.09, 189.11
See application file for complete search history.

(56) References Cited

U.S. PATENT DOCUMENTS

| | | | |
|---|---|---|---|
| 5,117,426 A | 5/1992 | Mcadams | |
| 5,258,958 A | 11/1993 | Iwahashi et al. | |
| 5,428,621 A | 6/1995 | Mehrotra et al. | |
| 5,587,948 A | 12/1996 | Nakai | |
| 5,600,594 A | 2/1997 | Padoan et al. | |
| 5,615,154 A | 3/1997 | Yamada | |
| 5,956,277 A | 9/1999 | Roohparvar | |
| 5,966,330 A | 10/1999 | Tang et al. | |
| 6,205,057 B1 | 3/2001 | Pan | |
| 6,226,200 B1 | 5/2001 | Eguchi et al. | |
| 6,242,936 B1 | 6/2001 | Ho et al. | |
| 6,285,598 B1 | 9/2001 | Khan et al. | |
| 6,324,094 B1 | 11/2001 | Chevallier | |
| 6,496,415 B2 | 12/2002 | Tsao | |
| 6,501,674 B2 | 12/2002 | Ashikaga | |
| 6,542,409 B2 | 4/2003 | Yamada | |
| 6,580,644 B1 | 6/2003 | Chung | |
| 6,639,833 B2 * | 10/2003 | Campardo et al. | 365/185.03 |
| 6,639,849 B2 | 10/2003 | Takahashi et al. | |
| 6,714,453 B2 | 3/2004 | Cavaleri et al. | |
| 6,781,884 B2 | 8/2004 | Yamada | |
| 6,819,612 B1 | 11/2004 | Achter | |
| 6,826,066 B2 * | 11/2004 | Kozaru | 365/52 |

(Continued)

Primary Examiner — Tuan T Nguyen
(74) Attorney, Agent, or Firm — Dorsey & Whitney LLP

(57) ABSTRACT

Described examples include leakage measurement systems and methods for measuring leakage current between a word line at a boosted voltage and a word line at a supply voltage. The boosted voltage may be generated by charge pump circuitry. Examples of leakage measurement systems described herein may be included in memory devices.

23 Claims, 4 Drawing Sheets

(56) References Cited

U.S. PATENT DOCUMENTS

| | | | |
|---|---|---|---|
| 6,839,279 B2 | 1/2005 | Yamada | |
| 6,912,160 B2 | 6/2005 | Yamada | |
| 6,975,542 B2 | 12/2005 | Roohparvar | |
| 7,031,210 B2 | 4/2006 | Park et al. | |
| 7,038,482 B1 | 5/2006 | Bi | |
| 7,180,781 B2 | 2/2007 | Abedifard et al. | |
| 7,317,658 B2 | 1/2008 | Takazawa et al. | |
| 7,336,545 B2 * | 2/2008 | Tanzawa | 365/189.09 |
| 7,397,708 B2 | 7/2008 | Oh | |
| 7,483,305 B2 | 1/2009 | Yamada | |
| 7,505,334 B1 | 3/2009 | Breitwisch et al. | |
| 7,619,924 B2 | 11/2009 | Bollu et al. | |
| 7,672,158 B2 | 3/2010 | Nakamura et al. | |
| 7,835,178 B2 | 11/2010 | Chen et al. | |
| 7,898,897 B2 | 3/2011 | Choi | |
| 7,965,577 B2 | 6/2011 | Chen et al. | |
| 8,514,630 B2 | 8/2013 | Huynh et al. | |
| 8,588,007 B2 | 11/2013 | Yamada | |
| 8,634,264 B2 | 1/2014 | Yamada | |
| 2002/0071314 A1 * | 6/2002 | Sakakibara et al. | 365/185.22 |
| 2002/0118574 A1 | 8/2002 | Gongwer et al. | |
| 2002/0149965 A1 * | 10/2002 | Campardo et al. | 365/185.03 |
| 2003/0151945 A1 * | 8/2003 | Tanzawa | 365/185.01 |
| 2005/0105333 A1 | 5/2005 | Park et al. | |
| 2006/0007733 A1 * | 1/2006 | Tanzawa | 365/185.01 |
| 2006/0083070 A1 | 4/2006 | Arakawa | |
| 2007/0216467 A1 * | 9/2007 | Akiyama et al. | 327/389 |
| 2009/0116290 A1 | 5/2009 | Yamada | |
| 2010/0125429 A1 | 5/2010 | Yamada | |
| 2010/0238729 A1 | 9/2010 | Lee et al. | |
| 2010/0329026 A1 * | 12/2010 | Nakamura et al. | 365/185.21 |
| 2012/0008384 A1 | 1/2012 | Li et al. | |
| 2012/0218833 A1 | 8/2012 | Yamada | |
| 2012/0230107 A1 * | 9/2012 | Ogura et al. | 365/185.11 |
| 2012/0281479 A1 | 11/2012 | Kochar et al. | |
| 2013/0107640 A1 | 5/2013 | Yamada | |
| 2014/0133249 A1 | 5/2014 | Yamada | |

* cited by examiner

LEAKAGE MEASUREMENT SYSTEMS

CROSS REFERENCE TO RELATED APPLICATION(S)

This application is a continuation of U.S. patent application Ser. No. 13/036,409, filed Feb. 28, 2011, and issued as U.S. Pat. No. 8,588,007 on Nov. 19, 2013, which application and patent are incorporated herein by reference, in their entirety and for any purpose.

TECHNICAL FIELD

Embodiments of the invention relate generally to memory devices, and more particularly, to leakage measurement in a memory device.

BACKGROUND

With increasing popularity of electronic devices, such as laptop computers, portable digital assistants, digital cameras, mobile phones, digital audio players, video game consoles and the like, nonvolatile memory usage has continued to increase. Nonvolatile memories come in various types, including flash memories. Flash memories are widely used for fast information storage in electronic devices such as those mentioned above and others.

In flash memories, data bits are stored in an array of individual memory cells, each of which includes a floating gate transistor. Generally speaking, each of the memory cells in a flash memory may have two gates instead of just one. One gate, the control gate, is analogous to the gate in a MOSFET. The other gate, the floating gate, is insulated all around by an oxide layer and is between the control gate and the substrate. Because the floating gate is insulated by its insulating oxide layer, any electrons placed on it get trapped there and thereby enable the storage of data. More specifically, when electrons are on the floating gate, their presence modifies, by partially canceling out, the electric field coming from the control gate. This results in the modification of the threshold voltage of the transistor, since a higher electric field is now required to enable an electrical current to flow between the source and the drain of the transistor than it would require without the electrons on the floating gate. If the number of electrons on the floating gate is sufficiently large, the resulting modified threshold voltage will be so high as to inhibit any electrical current to flow between the source and the drain when the normal operating voltage is applied to the control gate. Hence, in a typical flash memory cell that stores a binary bit, electrical current will either flow or not flow when a memory cell is being read by applying a voltage on the control gate, depending on the number of electrons on the floating gate. The flow or no flow of electrical current, in turn, translates to a binary bit 1 or 0, respectively.

In the pursuit of greater storage capacity in yet smaller chips, the flash memory density has been increasing over the years, largely due to the down scaling of the memory cell dimensions. The continued down scaling of electronic devices has created many challenges and opportunities, among them the formidable requirement for an ultra-thin gate oxide. One serious problem that comes along with thin oxide, and hinders further down scaling, is excessive leakage current. Specifically, when the oxide layer surrounding the floating gate of a flash memory cell is so thin that electrons stored on the floating gate may leak out (e.g., from the floating gate to the control gate and the word line that is coupled to the control gate, and eventually to ground), a result is that a binary bit 0 originally stored in the memory cell might now appear to be a binary bit 1.

Since the excessive leakage current for such an ultra-thin oxide will be unacceptable for very-large-scale integration (VLSI) applications, it is imperative that flash memories with unacceptable leakage current be identified during manufacturing process. As such, during manufacturing, flash memories are tested to assure that they are operating properly (e.g., having allowable leakage current). A leakage test may be conducted to measure the leakage current on the word lines of each flash memory to determine whether the leakage current on any of the word lines is excessive and thus unacceptable.

DETAILED DESCRIPTION

Figure 1:
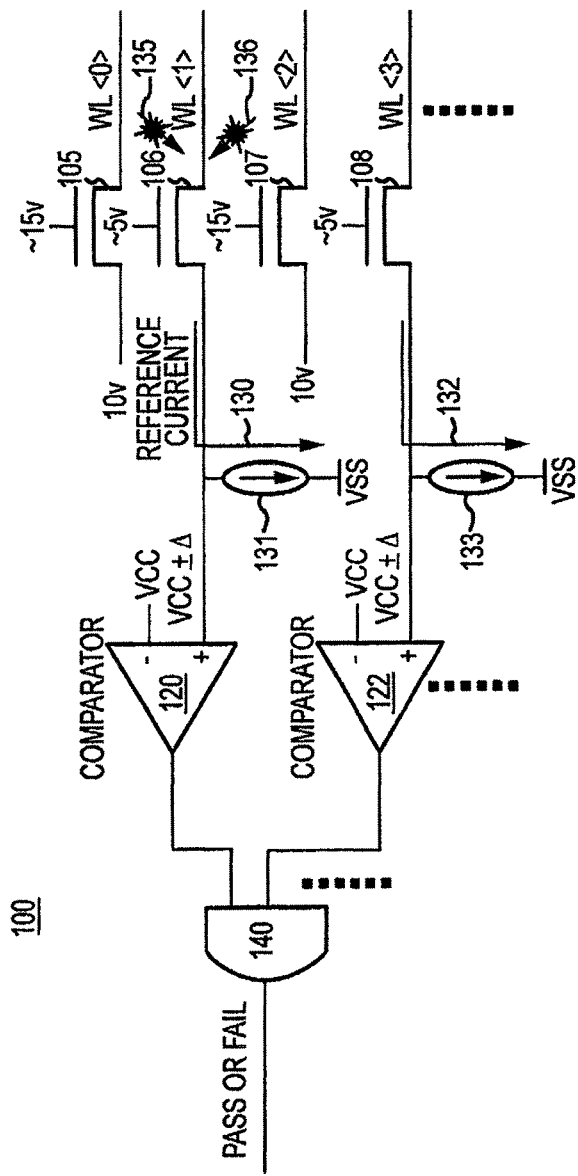
FIG. 1 is a schematic illustration of a leakage measurement system in accordance with an embodiment of the present invention.

Embodiments of the present invention include circuits, systems, and methods, for measuring leakage between word lines in memory devices. Embodiments of the present invention may measure leakage between a word line at a supply voltage (e.g. $V_{CC}$) and a word line at a higher voltage than the supply voltage (e.g. 10V), which may be generated by charge pump circuitry. The leakage between word lines at a supply voltage and those at a higher voltage may represent leakage conditions that exist during operation of a memory device. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Embodiments of word line leakage measurement circuitry have been described, for example, in U.S. Published Application 2010/0125429, which application is incorporated herein by reference in its entirety for any purpose. Examples described in U.S. Published Application 2010/0125429 include examples in which a word line is precharged to a supply voltage (e.g. $V_{CC}$) and a leakage current is measured between a word line voltage at a ground voltage (e.g. 0 volts) and the word line at the supply voltage (e.g. $V_{CC}$).

However, during operation of memory devices, a boosted voltage may be applied to one or more word lines. For example, a higher voltage than a supply voltage may be generated using charge pump circuitry. The boosted voltage may be applied to one or more word lines, for example during a programming operation. Accordingly, leakage may occur between a worldine at the supply voltage (e.g. $V_{CC}$) and a word line at a boosted voltage. The supply voltage, for example, $V_{CC}$, may be specified for a particular device, and in one example 3.6V may be used. The boosted voltage may be higher than $V_{CC}$. In one example the boosted voltage may be 15V. In another example the boosted voltage may be 10V. Other voltages may be used for $V_{CC}$, the boosted voltage, or both.

There may be difficulties in modifying a leakage measurement system such as those described in U.S. Published Application 2010/0125429 to measure leakage between a word line at a boosted voltage and a word line at a supply voltage. As stated above, Examples described in U.S. Published Application 2010/0125429 measure leakage current at a word line that has been precharged to the supply voltage (e.g. $V_{CC}$). A reference current is applied to that precharged word line, as is described in U.S. Published Application 2010/0125429. If the word line to be measured were instead precharged to a boosted voltage, the reference current may be required to operate under high voltage conditions. For example, the current generation circuitry described in U.S. Published Application 2010/0125429 may be required to include one or more high voltage p-FET transistors to generate a current to be applied to a word line at a boosted voltage. Generally speaking, high voltage transistors may not be commonly used in memory or other electronic device processes. Accordingly, to incorporate high voltage transistors may be prohibitively costly or time-consuming.

Embodiments of the present invention may advantageously allow for the measurement of current leakage between a word line charged to a boosted voltage and a word line charged to a supply voltage. Described embodiments may allow for such a measurement in a manner that is more readily integrated with commonly used electronic device circuitry. Although advantages of some embodiments have been described with reference to existing devices, it is to be understood that the described advantages are provided to aid in understanding only, and not all embodiments of the present invention may exhibit all, or any, of the described advantages.

FIG. 1 is a schematic illustration of a leakage measurement system in accordance with an embodiment of the present invention. The leakage measurement system 100 includes several word lines which may be measured. Although any number of word lines may be used, four are shown in FIG. 1 (WL<0>, WL<1>, WL<2>, and WL<3>). The word lines may be coupled to a particular voltage level through transistors 105-108, respectively. Word lines that are not being monitored by the leakage measurement system (the word lines WL<0> and WL<2> in FIG. 1) may be precharged to a boosted voltage, 10V in FIG. 1. The 10V may be coupled to the word lines WL<0> and WL<2> by applying a voltage to the transistors 105 and 107 sufficient to turn the transistors on, such as 15V as shown in FIG. 1. As mentioned above, the boosted voltage may be generated, for example, by charge pump circuitry. The boosted voltage may be used during normal operation of the electronic device.

Figure 3:
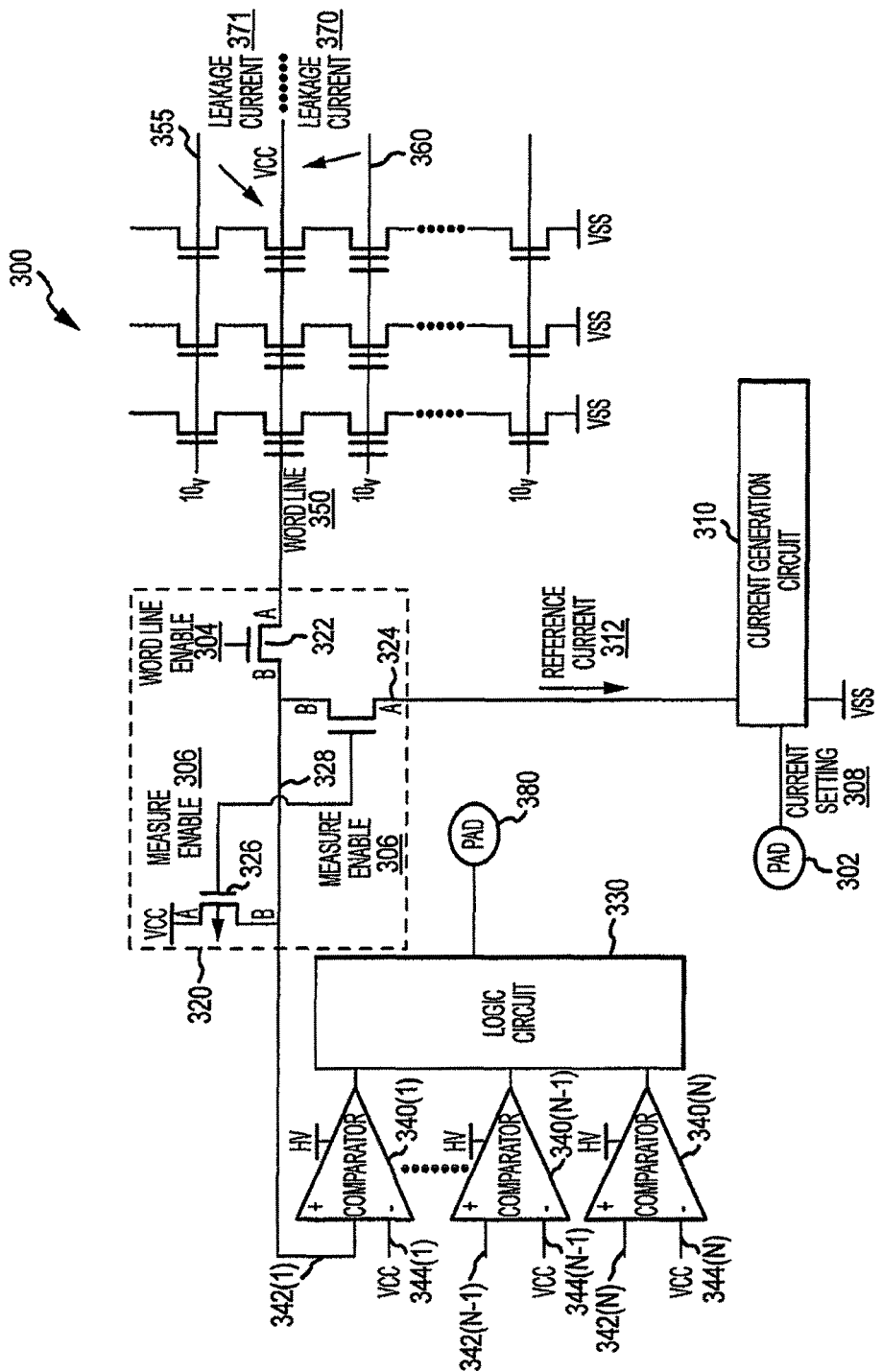
FIG. 3 is a schematic illustration of a leakage measurement system according to an embodiment of the present invention.

The word lines to be monitored, WL<1> and WL<3> in FIG. 3, may be precharged to a supply voltage, such as $V_{CC}$ as shown in FIG. 1. The transistors 106 and 108 may be turned on to couple a $V_{CC}$ voltage to the respective word lines WL<1> and WL<3>. As shown in FIG. 1, 5V may be sufficient at the gates of the transistors 106 and 108 to turn the transistors on. The monitored word line WL<1> is coupled to an input of a comparator 120 while the monitored word line WL<3> is coupled to an input of a comparator 122.

Reference currents 130 and 132 may be applied to the word lines WL<1> and WL<3> as shown in FIG. 1. The reference current 130 may be generated by a current source 131, while the reference current 132 may be generated by a current source 133. Note that the current sources 131 and 133 may be coupled between one supply voltage and another—such as $V_{CC}$ and $V_{SS}$ in FIG. 1. In this manner, specialized high voltage transistors may not be required to implement the current sources 131 and 133. Generally any current source circuitry may be used, including but not limited to current mirrors.

When the word line WL<1> is precharged to $V_{CC}$ and the word lines WL<0> and WL<2> are precharged to a boosted voltage, such as 10V, leakage currents may exist from the word lines WL<0> and WL<2> to the word line WL<1>, as shown by leakage currents 135 and 136 in FIG. 1. Similarly, leakage currents may exist from the word line WL<2> to the word line WL<3>. Although not shown in FIG. 1, another adjacent word line may also contribute leakage current to the word line WL<3>. When the reference current 130 is smaller in magnitude than the leakage currents 135 and 136, the voltage on the word line WL<1> may increase above $V_{CC}$. When the reference current 130 is larger in magnitude than the leakage currents 135 and 136, the voltage on the word line WL<1> may decrease below $V_{CC}$. The comparator 120 compares the voltage on the word line WL<1> to $V_{CC}$ and generates a signal indicative of the comparison. For example, if the voltage on the word line WL<1> exceeds $V_{CC}$ by greater than a threshold amount, the comparator 120 may output a signal indicative of an unacceptable amount of leakage current. If the voltage on the word line WL<1> is less than or equal to the threshold amount above $V_{CC}$, the comparator 120 may output a signal indicative of an acceptable amount of leakage current. In some examples, there may not be a threshold amount, and the comparator 120 may simply output a signal indicative of whether the word line voltage is greater or less than $V_{CC}$.

Similarly, when the reference current 132 is smaller in magnitude than the leakage currents received at the word line WL<3>, the voltage on the word line WL<3> may increase above $V_{CC}$. When the reference current 132 is larger in magnitude than the leakage currents received at the word line WL<3>, the voltage on the word line WL<3> may decrease below $V_{CC}$. The comparator 122 compares the voltage on the word line WL<3> to $V_{CC}$ and generates a signal indicative of the comparison. For example, if the voltage on the word line WL<3> exceeds $V_{CC}$ by greater than a threshold amount, the comparator 120 may output a signal indicative of an unacceptable amount of leakage current. If the voltage on the word line WL<3> is less than or equal to the threshold amount above $V_{CC}$, the comparator 120 may output a signal indicative of an acceptable amount of leakage current. In some examples, there may not be a threshold amount, and the comparator 120 may simply output a signal indicative of whether the word line voltage is greater or less than $V_{CC}$.

Logic 140 may be used to combine the signals generated by the comparators 120 and 122, and may generate a PASS or FAIL signal indicative of whether the electronic device as a whole has an acceptable or unacceptable amount of leakage current, respectively. In one example, the logic 140 may be implemented as an AND gate coupled to the comparators 120 and 122. The comparators 120 and 122 may output a logic 'high' responsive to an acceptable amount of leakage current (e.g. when the voltage on WL<1> or WL<3> respectively is equal to or lower than a threshold amount above $V_{CC}$). Accordingly, if either WL<1> or WL<3> evidences an unacceptable leakage current level, one or both of the comparators 120 or 122 may output a logic 'low', and the output of the logic 140 may also be 'low' indicating a FAIL. If both the word lines WL<1> and WL<3> evidence an acceptable amount of leakage current, the comparators 120 and 122 may both output a logic 'high' signal, and the logic 140 may also output a logic 'high' signal, indicating a PASS.

Figure 2:
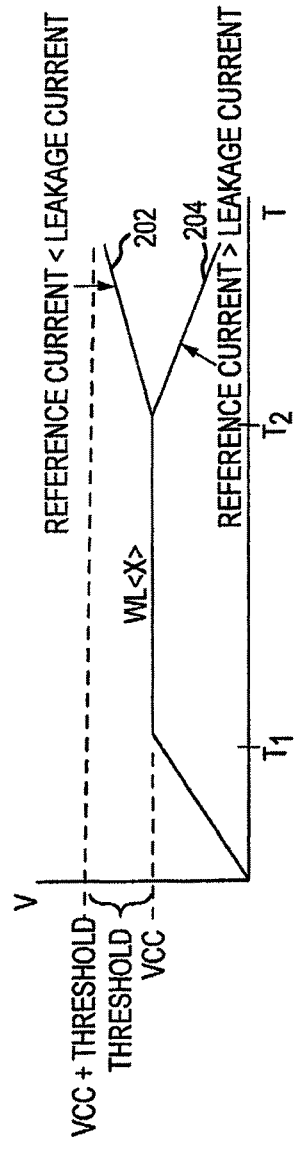
FIG. 2 is a schematic illustration of a voltage on a monitored word line in accordance with an embodiment of the present invention.

FIG. 2 is a schematic illustration of a voltage on a monitored word line in accordance with an embodiment of the present invention. As shown in FIG. 2, a voltage on a monitored word line, such as WL<1> or WL<3> of FIG. 1, may be precharged to $V_{CC}$ by a time $T_1$. As described above, leakage currents from other word lines may be received at the monitored word line, and a reference current may be coupled to the monitored word line, for example at time $T_2$. Following time $T_2$ if the reference current is less than the leakage current, the voltage on the monitored word line may increase, as indicated by the line 202. If the reference current is greater than the leakage current, the voltage on the monitored word line may decrease, as indicated by the line 204. If the reference current is less than a leakage current, once the voltage reaches a threshold amount over $V_{CC}$, the comparator 120 of FIG. 1 may generate a signal indicative of an unacceptable amount of leakage current.

FIG. 3 is a schematic illustration of a leakage measurement system 300 according to an embodiment of the present invention. As shown in FIG. 3, a current generation circuit 310 may receive a current setting signal 308 from an input pad 302 and generate a reference current 312 at one of a number of current values based on the current setting signal 308. Recall the reference currents 130 and 132 of FIG. 1. In some examples, the current generation circuit 310 of FIG. 3 may generate the reference currents 130 and 132 of FIG. 1.

Referring again to FIG. 3, the current generation circuit 310 may include a number of current mirrors that generate a number of reference currents from a master reference current. The current generation circuit 310 may be connected in parallel to a number of measurement enable circuits 320. The number of measurement enable circuits may be equal to the number of the word lines (or, word lines and select gates, in some examples, if leakage on the select gates is to be measured as well) in a memory device on which leakage current is to be measured. The number of measurement enable circuits may be referred to as N. In other words, the current generation circuit 310 may be connected in parallel to N measurement enable circuits 320. For simplicity, FIG. 3 only shows the current generation circuit 310 being connected to one of the N measurement enable circuits 320. In one embodiment, the reference current 312 may be supplied to only the word line (or select gate) on which leakage is to be measured. In an alternative embodiment, the current generation circuit 310 may be able to supply the same reference current to more than one word lines (and/or select gates), when leakage is measured on more than one word lines (and/or select gates) simultaneously, as the reference current 312 when leakage is measured on only one word line (or select gate).

Each of the measurement enable circuits 320 may be connected to one of the word lines (and select gates, in an alternative embodiment) of a memory device, and may also be connected to one of N comparing circuits, comparing circuits 340(1) through 340(N). The outputs of the comparing circuits 340(1)-340(N) may be received at a logic circuit 330, which may generate an output that is accessible externally through an output pad 380.

Each of the measurement enable circuits 320 may enable the word line or select gate on which leakage current is measured by allowing the voltage level on the word line or select gate to be measured while a reference current is being supplied to the word line or select gate. As shown in FIG. 3, the measurement enable circuit 320 includes transistors 322, 324 and 326, each of which functions as a switch. In one embodiment, as shown in FIG. 3, the transistors 322 and 324 may each be a n-type field effect transistor (n-FET), and the transistor 326 may be a p-type field effect transistor (p-FET).

In another embodiment, each of the transistors 322, 324 and 326 may be a switching circuit that is able to perform the functions described herein. The transistors are connected and arranged so that the described functionality of the measurement enable circuit 320 can be achieved. Each of the transistors 322, 324 and 326 may have one control terminal (e.g., the gate) and two signal terminals (e.g., the source and drain), terminals A and B. When a transistor 322, 324 or 326 is enabled, electrical current can flow from one terminal to the other. Conversely, when a transistor 322, 324 or 326 is disabled, there may be no current flow between its terminals. In FIG. 3, terminal A of the transistor 322 is connected to a corresponding word line 350, and terminal B of the transistor 322 is connected to an input terminal of a corresponding comparing circuit. Terminal B of the transistor 322 may also be connected to terminal B of the transistor 324 as well as terminal B of the transistor 326. The transistor 324 may be connected to the current generation circuit 310 at its terminal A. Terminal A of the transistor 326 is connected to a voltage source that is at a predetermined voltage level, $V_{cc}$ in FIG. 1.

The control terminal of the transistor 322 may receive a "word line enable" signal 304 that may have either a high (enable) value or a low (disable) value. The control terminal of the transistor 324 and the control terminal of the transistor 326 may be connected to each other and may receive a "measure enable" signal 306, which may have either a high (enable) value or a low (disable) value. The transistors 322 and 324 may be selected such that the transistors 322 and 324 are disabled when the signal on the control terminal is low, and enabled when the signal on the control terminal is high. Similarly, the transistor 326 may be selected such that it is enabled when the signal on its control terminal is low, and disabled when the signal is high.

In operation, before a word line/select gate is selected for leakage measurement, both the "word line enable" signal 304 and the "measure enable" signal 306 may be low. In one embodiment, the timing of the changes in the "word line enable" signal 304 and the "measure enable" signal 306 (e.g., going from low to high) may be arranged such that the "word line enable" signal 304 goes high first, followed by a period of time, before the "measure enable" signal 306 goes high. When both the "word line enable" signal 304 and the "measure enable" signal 306 are low, the transistors 322 and 324 may be disabled while the transistor 326 is enabled. With the transistor 326 enabled, the predetermined voltage level at terminal A of the transistor 326 (e.g., Vcc) is applied to the electrical line 328 that connects terminal B of the transistors 322, 324 and 326 with one another and one of the inputs of the corresponding comparing circuit (e.g., 340(1)), and thereby sets the voltage on the electrical line 328 to be at the predetermined voltage level.

When the "word line enable" signal 304 goes high, both the transistor 322 and the transistor 324 may be enabled. With the transistor 322 enabled, the word line 350 may be electrically coupled to the electrical line 328, and the voltage levels on both are equalized. Since the voltage on the electrical line 328 has been previously set to the predetermined voltage level (e.g., Vcc), when the transistor 322 is enabled the voltage on the word line 350 is also set to the predetermined voltage level. Accordingly, the word line 350 may be precharged to $V_{CC}$, as was described above with reference to FIG. 1 and word lines WL<1> and WL<3>. Other word lines shown in FIG. 3 may be precharged to a high voltage, such as 10V, by charge pump circuitry of the electrical device.

Referring again to FIG. 3, after a sufficient period of time that allows the voltage level on the word line 350 to settle at the predetermined voltage level (e.g., Vcc), the "measure enable" signal 306 may go high. This enables the transistor 324 and, at the same time, disables the transistor 326. Consequently, the voltage source at terminal A of the transistor 326 is electrically decoupled from the electrical line 328 as well as the word line 350. As such, any change in voltage level on the word line 350 and the electrical line 328 will be attributed to other factors, such as leakage currents. With the word lines such as 355 and 360 precharged to a boosted voltage, e.g. 10V in FIG. 3, and the word line 350 precharged to $V_{CC}$, leakage currents 370 and 371 may be received at the word line 350. With the transistor 324 enabled, the current generation circuit 310 is electrically coupled to the electrical line 328 as well as the word line 350. As a result, the reference current 312 is supplied to the electrical line 328 as well as the word line 350 since the transistor 322 is still enabled. It should be noted that the current generation circuit 310 may generate a current using circuitry coupled between the word line 350 (which may be precharged to $V_{CC}$) and another supply voltage, such as $V_{SS}$ in FIG. 3. While the leakage measurement system 300 may operate to measure leakage between word lines at a boosted voltage and a word line at a supply voltage, the current generation circuit 310 need not include high voltage transistors in some examples.

Depending on the size of the leakage currents 370 and 371 received at the word line 350, the voltage level on the electrical line 328 and the word line 350 may increase or decrease as the reference current 312 is being supplied to the electrical line 328 and the word line 350. If the leakage currents 370 and 371 received at the word line 350 is smaller in magnitude than the current value of the reference current 312, then the voltage level on the word line 350 (and on the electrical line 328) may decrease. In contrast, if the leakage currents 370 and 371 received at the word line 350 are larger in magnitude than the current value of the reference current 312, then the voltage level on the word line 350 (and on the electrical line 328) may increase. These relationships were also described above with reference to FIG. 2.

As shown in FIG. 3, the comparing circuit 340(1) has a first input terminal 342(1), connected to the electrical line 328, and a second input terminal 344(1), connected to the predetermined voltage level that is present at terminal A of the corresponding transistor 326. The other comparing circuits 340(2)-340(N) are set up similarly, but for simplicity, only the connections of comparing circuit 340(1) are shown. Each of the comparing circuits 340(1)-340(N), therefore, may compare the voltage level on its corresponding word line/select gate (which is electrically coupled to the electrical line that is physically connected to the first input terminal of the comparing circuit) with the predetermined voltage level that the word line/select gate was previously set to. In one embodiment, each of the comparing circuits 340(1)-340(N) is a comparator. In another embodiment, each of the comparing circuits 340(1)-340(N) may be a circuit that is able to compare two values.

In one embodiment, each of the comparing circuits 340(1)-340(N) may be enabled to compare the voltage levels on its two input terminals at some time after the "measure enable" signal 306 went high from low, in order to allow sufficient time for the voltage level on the word line/select gate of interest to either rise or fall for more accurate measurement. When the voltage level on the word line 350 is higher than the predetermined voltage level, signifying the leakage current 370 and 371 are greater than the reference current 312, the comparing circuit 340(1) generates an output signal indicating a FAIL. Likewise, when the voltage level on the word line 350 is lower than the predetermined voltage level, signifying the leakage currents 370 and 371 are smaller than the reference current 312, the comparing circuit 340(1) generates an output signal indicating a PASS.

According to one embodiment of the present invention, simultaneous, overlapping, or sequential leakage measurement on multiple word lines as well as individual leakage measurements on each of the word lines may be achievable. More specifically, a PASS/FAIL result representative of the results from the leakage measurement on all the N word lines may be accessible at the output pad 380, and the individual PASS/FAIL result from the leakage measurement on each of the N word lines may also be accessible at the output pad 380. In one embodiment, the logic circuit 330 may be a multiplexing logic circuit, the operation and structure of which are known in the art. In another embodiment, the logic circuit 330 may be a circuit that is able to perform the function described herein. The logic circuit 330 may receive the outputs of one or more of the comparing circuits 340(1)-340(N) and generate an output that is accessible externally through the output pad 380. For example, the logic circuit 330 may include N NAND logic circuits each of which receiving the output of a corresponding comparing circuit. In a simultaneous leakage measurement scenario, if one of the N word lines fails the leakage measurement at a given reference current value, the result seen at the output pad 380 may indicate a FAIL. This means that at least one of the word lines has an unacceptable leakage current compared to the reference current. Alternatively, in an individual leakage measurement scenario, the output of each of the comparing circuits 340(1)-340(N) may be connected to the output pad 380 by a transfer complementary metal-oxide-semiconductor (CMOS) logic, and thus the PASS/FAIL result for each of the N word lines may be individually seen at the output pad 380. In one embodiment, the selection of whether the type of leakage measurement is to be simultaneous leakage measurement or individual leakage measurement can be made by initial setting. For example, the selection may be included in the "reference current setting" stage. The selection circuit 380 can calculate or decode the outputs, based on the type of leakage measurement selected.

Figure 4:
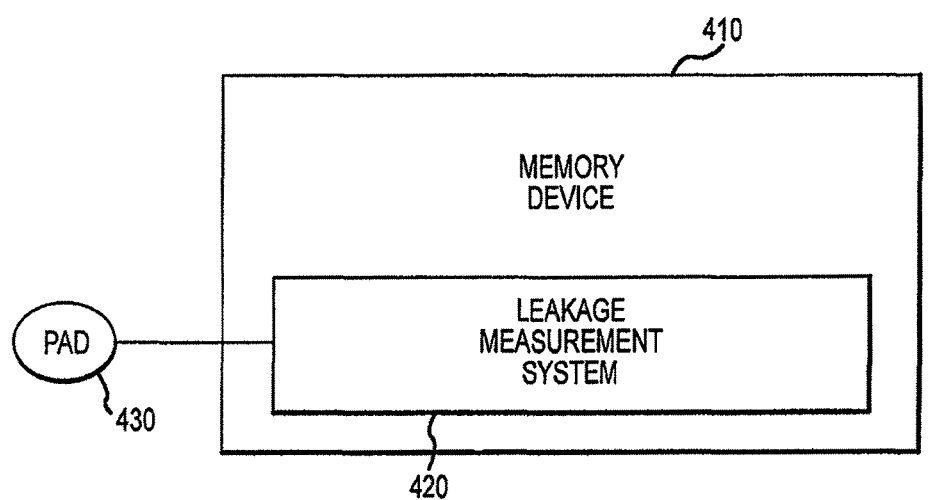
FIG. 4 is a schematic illustration of a memory device including a leakage measurement system in accordance with an embodiment of the present invention.

FIG. 4 is a schematic illustration of a memory device including a leakage measurement system in accordance with an embodiment of the present invention. The memory device 410 includes a leakage measurement system 420. The leakage measurement system 420 may be implemented using the leakage measurement system 300 of FIG. 3 or 100 of FIG. 1. The leakage measurement system 420 in memory device 410 may be coupled to the word lines (not shown) of the memory device 410. The leakage measurement system 420 may generate a reference current and determine whether a leakage current on one or more of the word lines is acceptable relative to the reference current, as has been described above.

In one embodiment, the leakage measurement system 420 in the memory device 210 may be able to generate a number of reference currents each at a current value different from the others. The leakage measurement system may receive an external signal for current setting through the input pad 430. Based on the decoding of this external signal, the leakage measurement system 420 may select one of the number of reference currents to be used to run a leakage test on respective ones of the word lines of the memory device 410.

By varying the current value of the reference current, leakage current on each of the word lines of the memory device 410 can be measured. For example, the leakage measurement system 420 may initially generate a reference current at an initial current value, and run a leakage test to determine whether the leakage on the word lines of the memory device 410 is acceptable. If, for example, the leakage test results indicate that the leakage current on each of the word lines of the memory device 410 is acceptable in comparison with the reference current (e.g., the leakage current on each of the word lines is less than the initial value), a different external signal may be sent to the leakage measurement system 420 through the input pad 430 so that the leakage measurement system 220 may generate a reference current at a different current value, and run another leakage test. In this example, if during this second leakage test the leakage current on one or more of the word lines of the memory device 410 is found to be unacceptable, the leakage measurement circuit 420 may determine that the leakage current on the one or more of the word lines that failed the leakage test is between the initial and second value. Meanwhile, the leakage current on each of all other word lines may be less than the second value, since the leakage current on those word lines was found to be acceptable during the second leakage test.

Accordingly, during a manufacturing process the memory device 410 may receive one or more external signals through the input pad 430, and each of the one or more external signals may then initiate a leakage test on the word lines of the memory device 410 that runs at a different reference current value. At the end of each of the one or more leakage tests, the leakage measurement system 420 may generate a PASS/FAIL signal, as described above which can be available at and accessible externally through an output pad, that indicates whether the memory device 410 has passed the particular leakage test.

In another embodiment, the leakage measurement system 420 in the memory device 410 may automatically run a series of leakage tests, each of which uses a reference current generated at one current value that is different from the reference current values used in other leakage tests in the series of tests. For example, the series of leakage tests may begin with a relatively high current value for the reference current, and gradually decrease the current value for the reference current in each of the subsequent leakage test. Accordingly, when the series of leakage tests are completed, the leakage measurement system 420 may have measured the leakage current on each of the word lines of the memory device 410. Furthermore, the result of each of the series of tests can be accessible externally through an output pad.

Therefore, by incorporating a built-in leakage measurement system, such as the leakage measurement system 420, in memory devices, the leakage current on the word lines of memory devices can be automatically measured without the use of an external leakage measurement instrument. Consequently, the manufacturing cycle and the overall product cost may be reduced in some examples.

Figure 5:
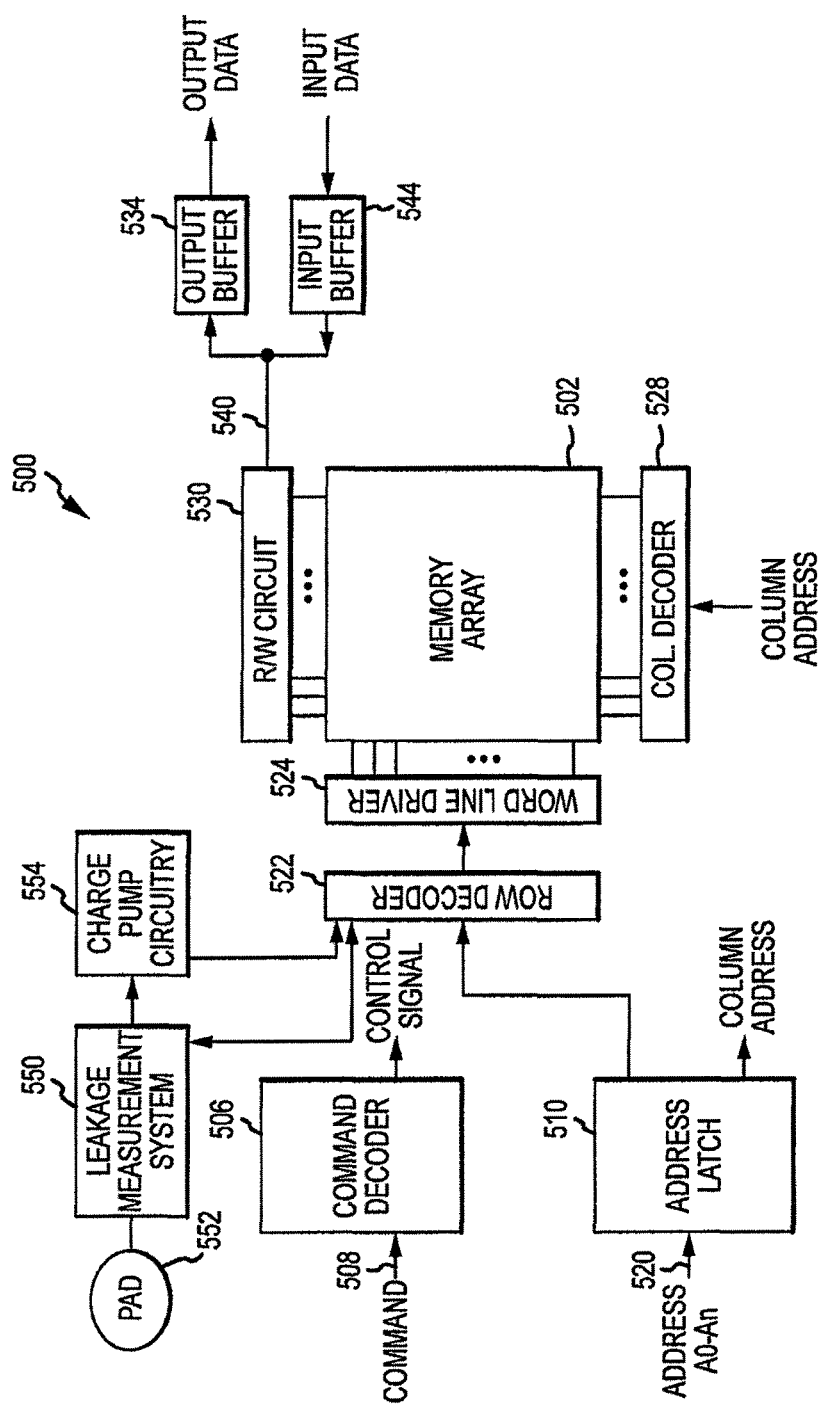
FIG. 5 is a schematic illustration of a portion of a memory according to an embodiment of the present invention.

FIG. 5 is a schematic illustration of a portion of a memory 500 according to an embodiment of the present invention. The memory 500 includes an array 502 of memory cells, which may be, for example, flash memory cells, such as but not limited to NAND cells, or some other type of memory cells. The memory 500 includes a command decoder 506 that receives memory commands through a command bus 508 and generates corresponding control signals within the memory 500 to carry out various memory operations. The command decoder 506 responds to memory commands applied to the command bus 508 to perform various operations on the memory array 502. For example, the command decoder 506 may be used to generate internal control signals to read data from and write data to the memory array 502. Row and column address signals may be applied to the memory system 500 through an address bus 520 and provided to an address latch 510. The address latch then may output a separate column address and a separate row address.

The row and column addresses are provided by the address latch 510 to a row address decoder 522 and a column address decoder 528, respectively. The column address decoder 528 may select bit lines extending through the array 502 corresponding to respective column addresses. The row address decoder 522 may be connected to word line driver 524 that activates respective word lines in the array 502 corresponding to received row addresses. The selected data line (e.g., a bit line or bit lines) corresponding to a received column address may be coupled to a read/write circuitry 530 to provide read data to a data output buffer 534 via an input-output data bus 540. Write data are applied to the memory array 502 through a data input buffer 544 and the memory array read/write circuitry 530.

A leakage measurement system 550 is also provided, and may be implemented, for example, using the leakage measurement system 100 of FIG. 1 or the leakage measurement system 300 of FIG. 3. The leakage measurement system 550 is coupled to at least one pad 552, as has been described above. The leakage measurement system 550 is configured to provide signals to, and receive signals from, the word lines of the memory array 502, as has been described above. Moreover charge pump circuitry 554 is provided to generate one or more boosted voltages that may be applied to word lines of the memory array 502 in accordance with signals received from the leakage measurement system 550. The charge pump circuitry 554 may be coupled to the row decoder 522, which may provide the boosted voltage to selected word lines.

The memory device shown in FIG. 5 may be implemented in any of a variety of products employing processors and memory including for example cameras, phones, wireless devices, displays, chip sets, set top boxes, gaming systems, vehicles, and appliances. Resulting devices employing the memory may benefit from the embodiments of leakage measurement described above to perform their ultimate user function.

From the foregoing it will be appreciated that, although specific embodiments of the invention have been described herein for purposes of illustration, various modifications may be made without deviating from the spirit and scope of the invention.

What is claimed is:

1. An apparatus comprising:
   charge pump circuitry configured to provide a boosted voltage to a word line of a plurality of word lines;
   measurement enable circuitry configured to provide a supply voltage to another word line of the plurality of word lines;
   a current source configured to provide a reference current to the other word line of the plurality of word lines;
   a comparator having a first input coupled to the other word line and a second input configured to receive the supply voltage, wherein the comparator is configured to generate a signal indicative of a comparison between the supply voltage and a voltage on the other word line.

2. The apparatus of claim 1, wherein the comparison between the supply voltage and a voltage on the other word line is indicative of whether leakage current at the word line is acceptable relative to the reference current.

3. The apparatus of claim 1, wherein the current source is configured to provide a plurality of reference currents of different values.

4. The apparatus of claim 1, further comprising logic coupled to the comparator, the logic configured to generate a signal indicating whether the leakage current at the other word line is acceptable.

5. The apparatus of claim 4 wherein the leakage current is determined to be acceptable based on a threshold amount.

6. The apparatus of claim 4, further comprising a comparator also coupled to the logic.

7. An apparatus comprising:
a current generation circuit configured to provide a reference current to at least one of a plurality of measurement enable circuits, wherein a measurement enable circuit of the plurality of measurement enable circuits is configured to provide the reference current to at least one of a plurality of word lines;
a plurality of comparing circuits, each comparing circuit of the plurality of comparing circuits having a first input coupled to a respective measurement enable circuit of the plurality of measurement enable circuits and a second input coupled to receive a supply voltage, and being configured to provide a signal at an output indicative of a comparison between the supply voltage and a voltage on a respective word line of the plurality of word lines.

8. The apparatus of claim 7 further comprising a second plurality of word lines and charge pump circuitry configured to generate a boosted voltage from the supply voltage and provide the boosted voltage to the second plurality of word lines.

9. The apparatus of claim 8 wherein the measurement enable circuits are configured to precharge the plurality of word lines before the charge pump circuitry generates the boosted voltage.

10. The apparatus of claim 7 wherein the current generation circuit is configured to provide a plurality of reference currents having different values.

11. The apparatus of claim 10 wherein the apparatus is configured to automatically run a series of leakage tests, each of the leakage tests configured to use a reference current having a value different than one used in other leakage tests in the series of leakage tests.

12. The apparatus of claim 7 further comprising an input pad coupled to the current generation circuit.

13. The apparatus of claim 12 wherein the current generation circuit receives a current setting signal from the input pad and is configured to generate a reference current at one of a number of current values based on the current setting signal.

14. The apparatus of claim 7 wherein the current generation circuit is connected in parallel to the plurality of measurement enable circuits.

15. The apparatus of claim 7 wherein a number of the plurality of measurement enable circuits is equal to a number of the plurality of word lines.

16. The apparatus of claim 7 further comprising an output pad coupled to the outputs of the plurality of comparing circuits.

17. The apparatus of claim 16, wherein the outputs of the plurality of comparing circuits are coupled to the output pad by transfer complementary metal-oxide semiconductor (CMOS) logic.

18. The leakage measurement system of claim 16 further comprising a logic circuit having a plurality of logic circuit inputs coupled to the outputs of the plurality of comparing circuits and a logic circuit output coupled to the output pad, wherein the logic circuit is configured to generate a logic signal indicative of whether the leakage current on the plurality of word lines is acceptable and the output pad is configured to make accessible the logic signal indicative of whether the leakage current on the plurality of word lines is acceptable.

19. The apparatus of claim 7 wherein the apparatus comprises at least one of a memory device, a camera, a phone, a wireless device, a display, a chip set, a set top box, a gaming system, a vehicle, or an appliance.

20. An apparatus comprising:
charge pump circuitry configured to provide a boosted voltage to a word line of a plurality of word lines, the boosted voltage being a higher voltage than a supply voltage;
a current source configured to be coupled between the supply voltage and a reference voltage, the current source to provide a reference current to another word line of the plurality of word lines; and
a comparator having a first input coupled to receive the supply voltage and a second input coupled to the other word line of the plurality of word lines, wherein the comparator is configured to generate a signal indicative of a comparison between the supply voltage and a voltage on the other word line.

21. The apparatus of claim 20, wherein the current source comprises a current mirror.

22. The apparatus of claim 20, further comprising logic coupled to the comparator and configured to generate a signal indicating whether the leakage current on the other word line of the plurality of word lines is acceptable.

23. The apparatus of claim 20, wherein the voltage on the other word line of the plurality of word lines is based, at least in part, on leakage currents between the word line and the other word line.

* * * * *